US009236367B1

(12) United States Patent
Chen et al.

(10) Patent No.: US 9,236,367 B1
(45) Date of Patent: Jan. 12, 2016

(54) METHOD AND APPARATUS FOR TRACKING INTERPOSER DIES IN A SILICON STACKED INTERCONNECT TECHNOLOGY (SSIT) PRODUCT

(71) Applicant: Xilinx, Inc., San Jose, CA (US)

(72) Inventors: Cinti X. Chen, Fremont, CA (US); Myongseob Kim, Pleasanton, CA (US); Xiao-Yu Li, Palo Alto, CA (US); Mohsen H. Mardi, Saratoga, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 14/625,145

(22) Filed: Feb. 18, 2015

Related U.S. Application Data

(63) Continuation of application No. 13/742,010, filed on Jan. 15, 2013, now Pat. No. 8,987,009.

(51) Int. Cl.
*H01L 27/12* (2006.01)
*H01L 25/00* (2006.01)
*H01L 23/544* (2006.01)
*H01L 25/065* (2006.01)
*H01L 23/00* (2006.01)
*H01L 23/498* (2006.01)

(52) U.S. Cl.
CPC ...... *H01L 25/0655* (2013.01); *H01L 23/49838* (2013.01); *H01L 23/544* (2013.01); *H01L 24/17* (2013.01); *H01L 2223/5442* (2013.01); *H01L 2223/54406* (2013.01); *H01L 2223/54433* (2013.01); *H01L 2223/54493* (2013.01); *H01L 2224/13124* (2013.01); *H01L 2224/16113* (2013.01); *H01L 2224/16227* (2013.01); *H01L 2224/1712* (2013.01); *H01L 2224/17515* (2013.01); *H01L 2924/01013* (2013.01); *H01L 2924/14* (2013.01)

(58) Field of Classification Search
None
See application file for complete search history.

(56) References Cited

U.S. PATENT DOCUMENTS

| 3,267,250 | A | 8/1966 | Ullery, Jr. |
| 5,821,624 | A | 10/1998 | Pasch |
| 6,451,191 | B1 | 9/2002 | Bentsen et al. |
| 8,525,169 | B1 | 9/2013 | Edelstein et al. |
| 2007/0096332 | A1* | 5/2007 | Satoh ............ H01L 23/481 257/777 |
| 2008/0253098 | A1 | 10/2008 | Liu |
| 2010/0025841 | A1* | 2/2010 | Kakegawa ......... H01L 23/562 257/692 |
| 2010/0052132 | A1* | 3/2010 | Baek ............ H01L 23/49816 257/686 |
| 2011/0070697 | A1* | 3/2011 | Tsai ................ H01L 25/50 438/109 |
| 2011/0298128 | A1 | 12/2011 | Schuetz |
| 2013/0127039 | A9 | 5/2013 | Omandam et al. |

(Continued)

OTHER PUBLICATIONS

Specification and drawings for U.S. Appl. No. 13/742,010, filed Jan. 15, 2013, Chen et al.

(Continued)

*Primary Examiner* — Joseph Schoenholtz
(74) *Attorney, Agent, or Firm* — Gerald Chan

(57) ABSTRACT

An apparatus for a stacked silicon interconnect technology (SSIT) product comprises an interposer die, a plurality of integrated circuit dies, a plurality of active components forming an active connection between the integrated circuit dies and the interposer die, and a plurality of dummy components at the interposer die, the dummy components not forming an active connection between the integrated circuit dies and the interposer die. At least a subset of the dummy components forms a pattern, and the pattern comprises an identifier for the interposer die.

17 Claims, 5 Drawing Sheets

(56) References Cited

U.S. PATENT DOCUMENTS

2013/0134607 A1 5/2013 Gillingham
2013/0154076 A1 6/2013 Camacho et al.

OTHER PUBLICATIONS

Definition of "dummy" downloaded from URL<http://www.meriam.webster.com/dictionary/dummy> on Sep. 23, 2014.

Banijamali, Bahareh et al., "Ceramics vs. low-CTE Organic packaging of TSV Silicon Interposers," May 31, 2011, Proc. of the 2011 IEEE 61st Electronic Components and Technology Conference, pp. 573-576, IEEE, Piscataway, New Jersey, USA.

Lau, John H., "3D IC Packing and 3D IC Integration," IEEE Orlando Section Monthly, Nov. 2013, pp. 1-78, vol. 46, No. 10, IEEE, Piscataway, New Jersey, USA.

Pan, Jianbiao et al., "Wire Bonding Challenges in Optoelectronics Packaging," TP04PUB284, Aug. 1, 2004, pp. 1-10, Society of Manufacturing Engineers, Dearborn, Michigan, USA.

* cited by examiner

METHOD AND APPARATUS FOR TRACKING INTERPOSER DIES IN A SILICON STACKED INTERCONNECT TECHNOLOGY (SSIT) PRODUCT

CROSS-REFERENCE TO RELATED APPLICATION

This application is a continuation of U.S. patent application Ser. No. 13/742,010 filed on Jan. 15, 2013, which is hereby incorporated herein by reference.

TECHNICAL FIELD

This application relates generally to silicon stacked interconnect technology (SSIT) products, and in particular, to a method and apparatus for tracking interposer dies in an SSIT product.

BACKGROUND

Silicon stacked interconnect technology (SSIT) involves packaging multiple integrated circuit (IC) dies into a single package that includes an interposer die and a package substrate. Utilizing SSIT expands FPGA products into higher density, lower power, greater functionality, and application specific platform solutions with low cost and fast-to-market advantages. While SSIT products provide several advantages, the logistics associated with tracking such SSIT products becomes quite challenging.

Tracking components of the SSIT product, particularly the interposer die of the SSIT product is important for several reasons. Tracking an interposer die to its wafer of origin, its location on the wafer of origin, and its wafer lot, allows defective interposer dies to be easily identified and further provides quick feedback for identifying other potentially defective SSIT products that may be associated with the defective interposer die. Furthermore, particular characteristics for interposer dies (e.g., leakage current) may be easily identified to facilitate establishment of performance criteria for SSIT products.

Conventional methods for tracking integrated devices use active electrical circuits within the integrated device. For example, integrated devices may include fuses which may be blown to create unique identifiers for the integrated device. Currently, however, interposer dies of an SSIT product are passive components that include only metal interconnects and do not include any active circuitry. Even if interposer dies of an SSIT product are implemented with active circuitry for future use, the use of polysilicon or metal fuses for identification is impractical because of its high costs. Besides having a higher cost, the fuse circuits will also require additional die area. Moreover, fuse circuits will also have potential design, process defect and variation issues associated with technologies that have critical dimensions less than 65 nm. As such, existing tracking methods cannot be used to track interposer dies of an SSIT product.

SUMMARY

A method for tracking an interposer die of a stacked silicon interconnect technology (SSIT) product includes forming a plurality of dummy components on the interposer die, and modifying one or more of the plurality of dummy components on the interposer die to form a unique identifier for the interposer die.

Optionally, the plurality of dummy components may comprise a plurality of dummy microbumps.

Optionally, the act of modifying one or more of the plurality of dummy microbumps on the interposer die may comprise laser zapping one or more of the plurality of dummy microbumps on the interposer die.

Optionally, the act of modifying one or more of the plurality of dummy microbumps on the interposer die may comprise dispensing fluorescent material onto one or more of the plurality of dummy microbumps on the interposer die.

Optionally, the act of dispensing fluorescent material onto one or more of the plurality of dummy microbumps on the interposer die may be performed using an ink jet or laser printer.

Optionally, the act of dispensing fluorescent material onto one or more of the plurality of dummy microbumps on the interposer die may be performed using a pre-patterned carrier.

Optionally, the plurality of dummy components may comprise a plurality of dummy aluminum pads.

Optionally, the act of modifying one or more of the plurality of dummy components may comprise laser zapping one or more of the plurality of dummy aluminum pads.

Optionally, at least one of the plurality of dummy aluminum pads may be laser zapped more than once.

Optionally, the plurality of dummy aluminum pads may represent a coordinate system.

Optionally, the unique identifier for the interposer die may be used to track one or more of the following: a wafer of origin from which the interposer die originated, a location on the wafer of origin from which the interposer die originated, a wafer lot from which the interposer die originated, or one or more electrical characteristics associated with the interposer die.

Optionally, the dummy components may be partitioned into various segments, and wherein each of the segments may be used to identify a different characteristic associated with the interposer die.

An apparatus for a stacked silicon interconnect technology (SSIT) product includes an interposer die, and a plurality of dummy components at the interposer die. One or more of the plurality of dummy components is modifiable to form a unique identifier for the interposer die.

Optionally, the plurality of dummy components may comprise a plurality of dummy bumps.

Optionally, at least one of the plurality of dummy bumps may be configured for modification by laser zapping or by fluorescent ink deposition to form the unique identifier.

Optionally, the plurality of dummy components may comprise a plurality of dummy aluminum pads.

Optionally, at least one of the plurality of dummy aluminum pads may be configured for modification by laser zapping to form the unique identifier.

Optionally, the plurality of dummy aluminum pads may represent a coordinate system.

Optionally, the unique identifier for the interposer die may be configured to track one or more of the following: a wafer of origin from which the interposer die originated, a location on the wafer of origin from which the interposer die originated, a wafer lot from which the interposer die originated, or one or more electrical characteristics associated with the interposer die.

Optionally, the dummy components may be partitioned into various segments, and wherein each of the segments may identify a different characteristic associated with the interposer die.

Other and further aspects and features will be evident from reading the following detailed description of the embodiments.

BRIEF DESCRIPTION OF THE DRAWINGS

The drawings illustrate the design and utility of embodiments, in which similar elements are referred to by common reference numerals. These drawings are not necessarily drawn to scale. In order to better appreciate how the above-recited and other advantages and objects are obtained, a more particular description of the embodiments will be rendered, which are illustrated in the accompanying drawings. These drawings depict only exemplary embodiments and are not therefore to be considered limiting of the scope of the claims.

FIG. 3-1 is a side-view schematic diagram illustrating a method for tracking interposer dies in an SSIT product.

FIG. 3-2 is a top-view schematic diagram of an SSIT product with an interposer die that has been modified according to the method of FIG. 3-1.

FIG. 4-1 is a side-view schematic diagram illustrating a method for tracking interposer dies in an SSIT product.

FIG. 4-2 is a top-view schematic diagram of an SSIT product with an interposer die that has been modified according to the method of FIG. 4-1.

FIG. 5-1 is a side-view schematic diagram illustrating a method for tracking interposer dies in an SSIT product.

FIG. 5-2 is a top-view schematic diagram of an SSIT product with an interposer die that has been modified according to the method of FIG. 5-1.

FIG. 6-1 is a side-view schematic diagram illustrating a method for tracking interposer dies in an SSIT product.

FIG. 6-2 is a top-view schematic diagram of an SSIT product with an interposer die that has been modified according to the method of FIG. 6-1.

DETAILED DESCRIPTION

Figure 1:
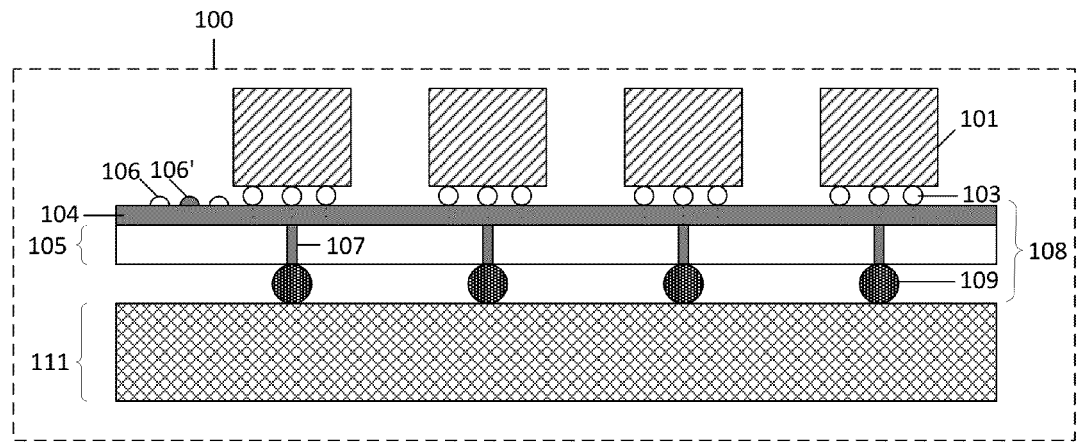
FIG. 1 is a side-view schematic diagram illustrating a stacked silicon interconnect technology (SSIT) product.

Various embodiments are described hereinafter with reference to the figures. It should be noted that the figures are not drawn to scale and that the elements of similar structures or functions are represented by like reference numerals throughout the figures. It should be noted that the figures are only intended to facilitate the description of the embodiments. They are not intended as an exhaustive description of the invention or as a limitation on the scope of the claimed invention. In addition, an illustrated embodiment need not have all the aspects or advantages shown. An aspect or an advantage described in conjunction with a particular embodiment is not necessarily limited to that embodiment and can be practiced in any other embodiments even if not so illustrated. Also, reference throughout this specification to "some embodiments" or "other embodiments" means that a particular feature, structure, material, or characteristic described in connection with the embodiments is included in at least one embodiment. Thus, the appearances of the phrase "in some embodiments" or "in other embodiments" in various places throughout this specification are not necessarily referring to the same embodiment or embodiments.

Silicon stacked interconnect technology (SSIT) products involve packaging multiple integrated circuit (IC) dies into a single package that includes an interposer die and a package substrate. Utilizing SSIT expands FPGA products into higher density, lower power, greater functionality, and application specific platform solutions with low cost and fast-to-market advantages.

FIG. 1 is a side-view schematic diagram illustrating a stacked silicon interconnect technology (SSIT) product 100. The SSIT product 100 includes a plurality of integrated circuit dies 101, an interposer die 108, and a package substrate 111. The interposer die 108 may include an interposer die substrate 105, a metal layer 104, dummy components 106, 106' and C4 bumps 109.

The integrated circuit dies 101 may be electrically coupled to the interposer die 108 through microbumps 103 and metal layer 104. While only one set of microbumps 103 is illustrated, it is important to note that both the integrated circuit dies 101 and the interposer die 103 may have their own corresponding microbumps which are joined together during packaging. While the metal layer 104 is depicted as a single layer, it is important to note that several metal layers may be used to facilitate connection between the interposer die 105 and the microbumps 103.

The interposer die substrate 105 may include through-silicon-vias 107 to facilitate connections between the integrated circuit dies 101 via the metal layer 104 on the one hand and the package substrate 111 on the other hand. Additionally, the interposer die 108 may be electrically coupled to the package substrate 111 through C4 bumps 109. The final SSIT product 100 allows for a plurality of integrated circuit dies 101, each of which may provide a different set of functionalities, to be packaged in a single product to provide the advantages discussed above.

While SSIT products provide several advantages, the logistics associated with tracking such SSIT products becomes quite challenging. Tracking components of the SSIT product, particularly the interposer die of the SSIT product is important for several reasons. Tracking an interposer die to its wafer of origin, its location on the wafer of origin, and its wafer lot, allows defective interposer dies to be easily identified and further provides quick feedback for identifying other potentially defective SSIT products that may be associated with the defective interposer die. Furthermore, particular characteristics for interposer dies (e.g., leakage current) may be easily identified to facilitate establishment of performance criteria for SSIT products.

Conventional methods for tracking integrated devices use active electrical circuits within the integrated device. For example, integrated devices may include fuses which may be blown to create unique identifiers for the integrated device. Currently, however, interposer dies of an SSIT product are passive components that include only metal interconnects and do not include any active circuitry. Even if interposer dies of an SSIT product are implemented with active circuitry for future use, the use of polysilicon or metal fuses for identification is impractical because of its high costs. Besides having a higher cost, the fuse circuits will also require additional die area. Moreover, fuse circuits will also have potential design, process defect and variation issues associated with technologies that have critical dimensions less than 65 nm. As such, existing tracking methods cannot be used to track interposer dies of an SSIT product.

However, interposer dies 108 may be tracked using certain dummy components that are formed on the SSIT product 100 to improve certain mechanical characteristics associated with the SSIT product 100. As illustrated in FIG. 1, interposer dies 108 typically include dummy components such as dummy microbumps 106, 106'. One or more of the dummy microbumps 106' may be used for tracking the interposer die 108 in some embodiments, which will be described in more detail below. It is important to note that other dummy components such as dummy aluminum pads (not shown), which may also be included in interposer dies 108 may also be used for tracking the interposer die 108 in some embodiments, which will also be described in more detail below. Dummy components alleviate some of the problems associated with conventional tracking methods. For one, dummy components may not require additional area since the dummy components may be located at the die seal or die corner. Additionally, the dummy components have large dimensions (in tens of microns) and are fabricated using mature processes such that potential design, process defect and variation issues are greatly reduced.

Figure 2:
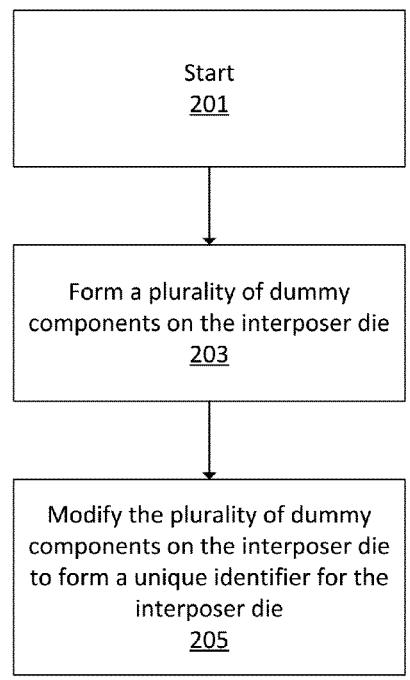
FIG. 2 is a flow chart illustrating a method for tracking interposer dies in an SSIT product.

FIG. 2 is a flow chart illustrating a method for tracking interposer dies in an SSIT product. The method starts at 201. Initially, a plurality of dummy components are formed on the interposer die as shown at 203. In some embodiments, the plurality of dummy components may be a plurality of dummy microbumps. As used hereinafter, the term "dummy microbumps" refers to microbumps that do not form an active connection between the integrated circuit dies of the SSIT package and the interposer die of the SSIT package. In other embodiments, the plurality of dummy components may be a plurality of aluminum pads. As used hereinafter, the term "dummy aluminum pads" refers to aluminum pads that need not provide any functionality other than tracking the SSIT product.

The dummy components may be formed during the normal process flow of designing the SSIT product, which will be described in further detail below. The dummy components may be formed initially for purposes other than tracking, such as for pattern density purposes. Such dummy components may be later identified for use as tracking components for the interposer die of the SSIT product.

In some embodiments, the dummy components may be formed on a die edge of the interposer die. In other embodiments, the dummy components may be formed in a die seal area of the interposer die. By placing the dummy components on the die edge or in the die seal area of the interposer die, potential issues associated with defectiveness of the final SSIT product may be avoided. Furthermore, placing the dummy components on the die edge or in the die seal area of the interposer die allows tracking of the interposer die even after the SSIT product has been formed.

Once the dummy components have been formed on the interposer die, the plurality of dummy components may be modified to form a unique identifier for the interposer die as shown at 205. In some embodiments, where the plurality of dummy components are a plurality of dummy microbumps, the dummy microbumps may be modified using laser zapping or fluorescent ink deposition, which will be described in further detail below. In some other embodiments, where the plurality of dummy components are a plurality of dummy aluminum pads, the dummy aluminum pads may be modified using laser zapping, which will be described in further detail below.

The dummy components may be modified during the normal process flow of designing the SSIT product, which will be described in further detail below.

The modified dummy components of the interposer die may be used to track one or more characteristics of the interposer die. In some embodiments, the modified dummy components may be used to track the wafer of origin from which the interposer die originated. In other embodiments, the modified dummy components may be used to track the location on the wafer of origin from which the interposer die originated. In other embodiments, the modified dummy components may be used to track the wafer lot from which the interposer die originated. In other embodiments, the modified dummy components may be used to track one or more particular electrical characteristics associated with the interposer die (e.g., leakage current). In further embodiments, the modified dummy components may be used to track a combination of the features mentioned above, and/or other features of the interposer die.

In some embodiments, the dummy components may be partitioned into various segments, wherein each segment may be used to identify a different characteristic associated with the interposer die (e.g., wafer of origin, location on the wafer of origin, wafer lot, electrical characteristic such as leakage current, etc.).

As mentioned above, the formation and modification of dummy components may occur during the normal process flow of fabricating the SSIT product. An example of a normal process flow for fabricating an interposer die of an SSIT product includes: 1) receiving a wafer from a lot of wafers, 2) partitioning the wafer into a plurality of interposer dies, 3) forming through-silicon-vias within each die of the plurality of interposer dies, 4) forming one or more metal layers that include aluminum pads on the interposer die, 5) forming a plurality of microbumps on the interposer die, 6) forming a plurality of C4 bumps on the interposer die, and 7) dicing the wafer to form individual interposer dies.

In some embodiments, where the dummy components are dummy microbumps, the dummy microbumps may be formed during the act of forming the plurality of microbumps on the interposer die. For example, a modified mask may be used during the fabrication process to form the plurality of dummy microbumps in predetermined locations on the interposer die. After the dummy microbumps have been formed on the interposer die and before the C4 bumps are formed, the dummy microbumps may be modified using laser zapping or fluorescent ink deposition to form a unique identifier for the interposer die.

In some other embodiments, where the dummy components are dummy aluminum pads, the dummy aluminum pads may be formed during the act of forming one or more metal layers. For example, a modified mask may be used during the fabrication process to form the plurality of dummy aluminum pads in predetermined locations on the interposer die. After the dummy aluminum pads have been formed and before the microbumps are formed, the dummy aluminum pads may be modified using laser zapping to form a unique identifier for the interposer die.

After the dummy components have been modified, the rest of the SSIT product may be assembled.

Tracking the interposer die to its wafer of origin, its location on the wafer of origin, its wafer lot, and to its electrical characteristics allows defective interposer dies to be easily identified and further provides quick feedback for identifying other potentially defective SSIT products that may be associated with the defective interposer die. Furthermore, particular characteristics for interposer dies (e.g., leakage current) may be easily identified to facilitate establishment of performance criteria for SSIT products.

Figures 1, 3:
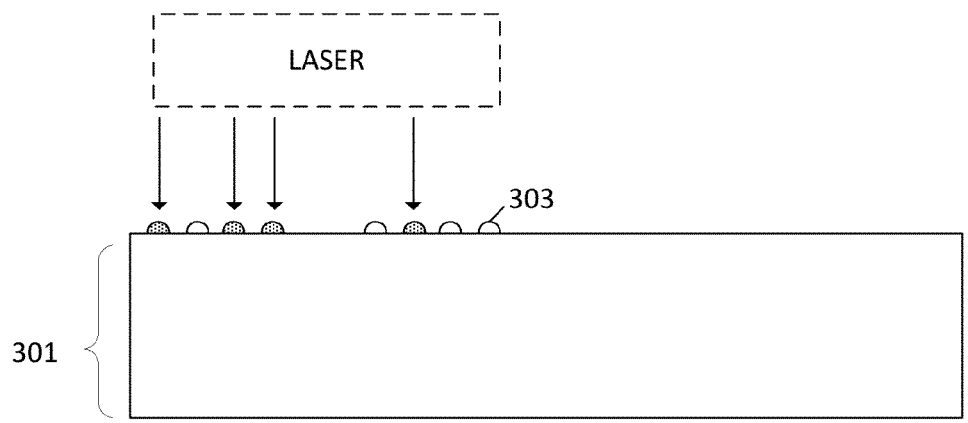
Figures 2, 3:
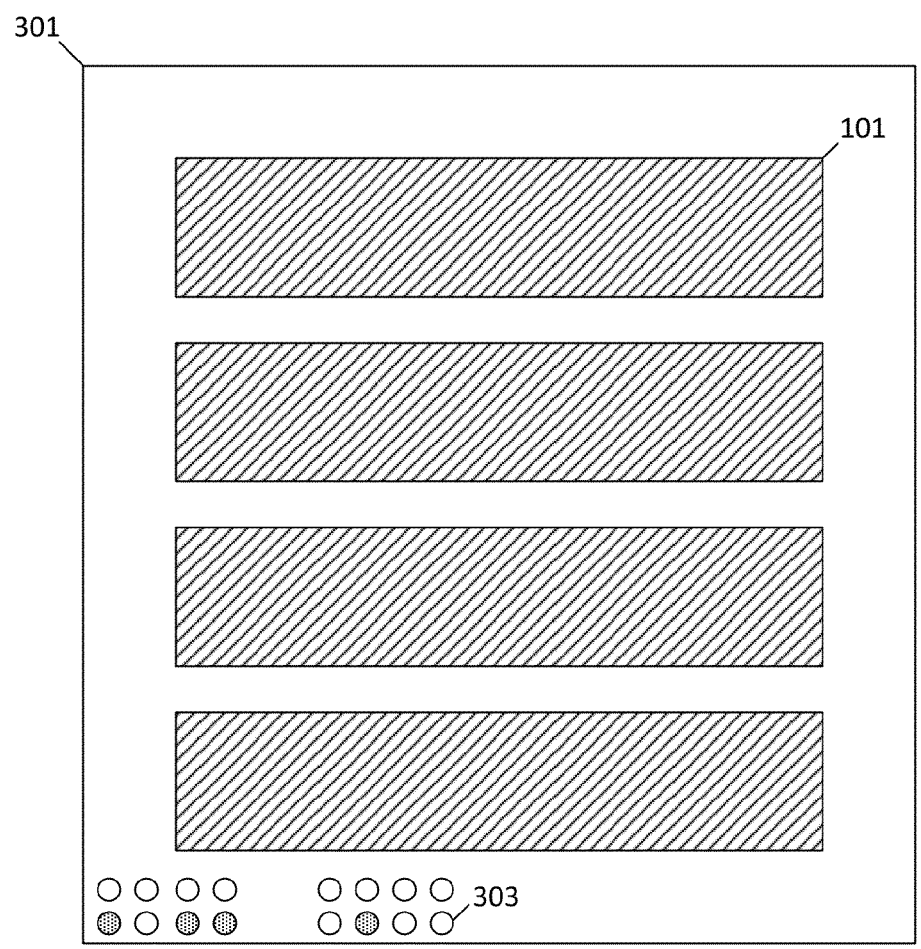

FIG. 3-1 is a side-view schematic diagram illustrating a method for tracking interposer dies in an SSIT product according to some embodiments. An interposer die 301 with a plurality of dummy microbumps 303 undergoes laser zapping to form a unique identifier for the interposer die 301. Laser zapping a dummy microbump eliminates the dummy microbump such that a pattern formed by the plurality of dummy microbumps after laser zapping represents a unique identifier for the interposer die. The dummy microbumps that have been laser zapped are depicted as patterned microbumps 303 in FIG. 3-1. Various combinations of microbumps 303 may be laser zapped to form different unique identifiers for an interposer die 301.

FIG. 3-2 is a top-view schematic diagram of an SSIT product with an interposer die that has been modified according to the method of FIG. 3-1 according to some embodiments. As illustrated in FIG. 3-2, the plurality of dummy microbumps 303 on the interposer die 301 are patterned using laser zapping to represent a unique identifier for the interposer die 301.

As mentioned above, the modified dummy microbumps may be used to track the wafer of origin from which the interposer die originated, the location on the wafer of origin from which the interposer die originated, the wafer lot from which the interposer die originated, or one or more particular electrical characteristics associated with the interposer die (e.g., leakage current), for example.

Also, as mentioned above, the dummy microbumps may be partitioned into various segments, wherein the set of modified dummy microbumps for each segment may be used to identify a different characteristic associated with the interposer die (e.g., wafer of origin, location on the wafer of origin, wafer lot, an electrical characteristic such as leakage current, etc.). For example, while the configuration of the dummy microbumps 303 in FIG. 3-2 may represent a single identification, in other embodiments, the configuration may represent two identifications (e.g., one identification represented by the eight dummy microbumps on the left side, and another identification represented by the eight dummy microbumps on the right side).

Figures 1, 4:
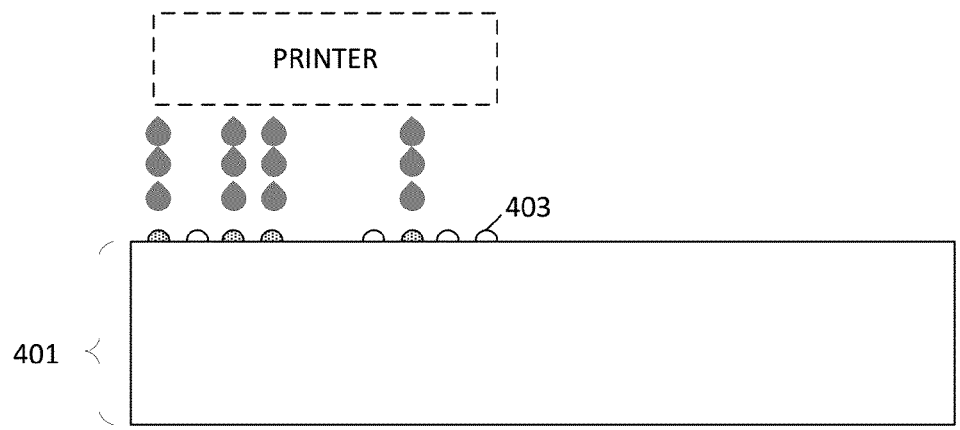
Figures 2, 4:
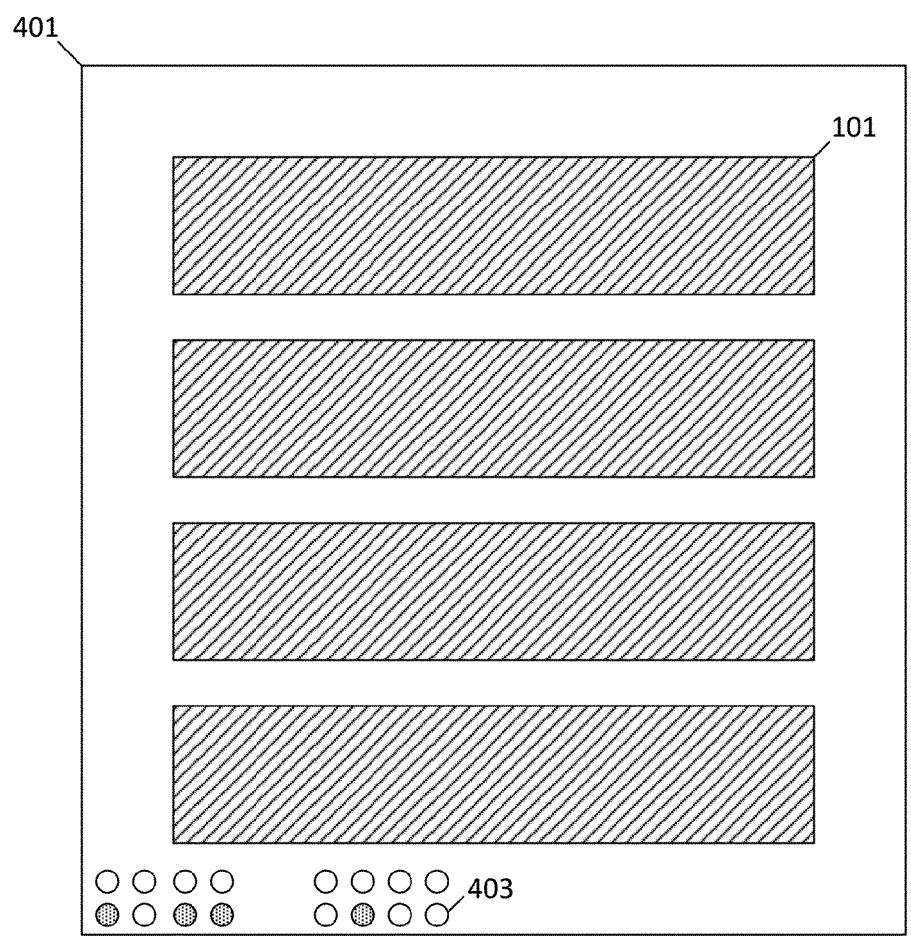

FIG. 4-1 is a side-view schematic diagram illustrating a method for tracking interposer dies in an SSIT product according to some embodiments. An interposer die 401 with a plurality of dummy microbumps 403 undergoes fluorescent ink deposition to form a unique identifier for the interposer die 401. In FIG. 4-1, fluorescent ink is deposited onto the dummy microbumps 403 using a printer-like device such as a high resolution ink jet or laser printer. However, one ordinarily skilled in the art will recognize that various devices can be used to dispense or provide droplets of fluorescent materials onto the dummy microbumps 403. Any fluorescent material that may be viewed using a fluorescent scanner or reader may be used.

The dummy microbumps that have undergone fluorescent ink deposition are depicted as patterned microbumps 403 in FIG. 4-1. Various combinations of microbumps 403 may undergo fluorescent ink deposition to form different unique identifiers for an interposer die 401.

FIG. 4-2 is a top-view schematic diagram of an SSIT product with an interposer die that has been modified according to the method of FIG. 4-1 according to some embodiments.

As illustrated in FIG. 4-2, the plurality of dummy microbumps 403 on the interposer die 401 are patterned using fluorescent ink deposition via printer to represent a unique identifier for the interposer die 401.

As mentioned above, the modified dummy microbumps may be used to track the wafer of origin from which the interposer die originated, the location on the wafer of origin from which the interposer die originated, the wafer lot from which the interposer die originated, or one or more particular electrical characteristics associated with the interposer die (e.g., leakage current), for example.

Also, as mentioned above, the dummy microbumps may be partitioned into various segments, wherein the set of modified dummy microbumps for each segment may be used to identify a different characteristic associated with the interposer die (e.g., wafer of origin, location on the wafer of origin, wafer lot, leakage current, etc.). For example, while the configuration of the dummy microbumps 403 in FIG. 4-2 may represent a single identification, in other embodiments, the configuration may represent two identifications (e.g., one identification represented by the eight dummy microbumps on the left side, and another identification represented by the eight dummy microbumps on the right side).

Figures 1, 5:
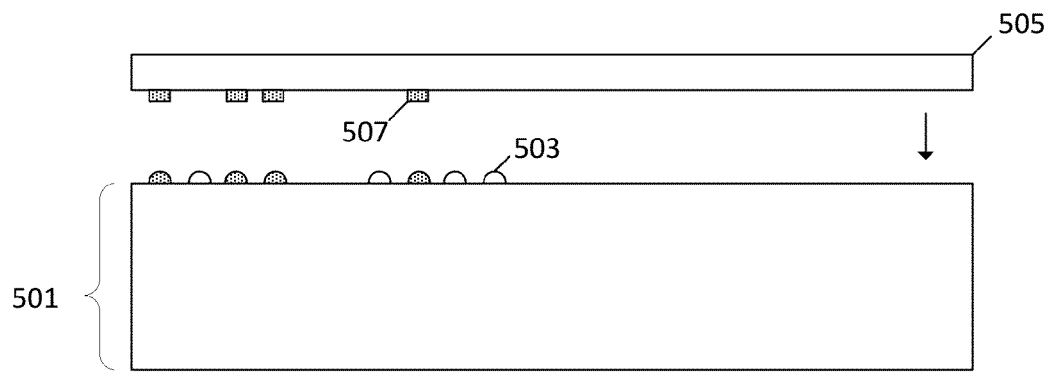
Figures 2, 5:
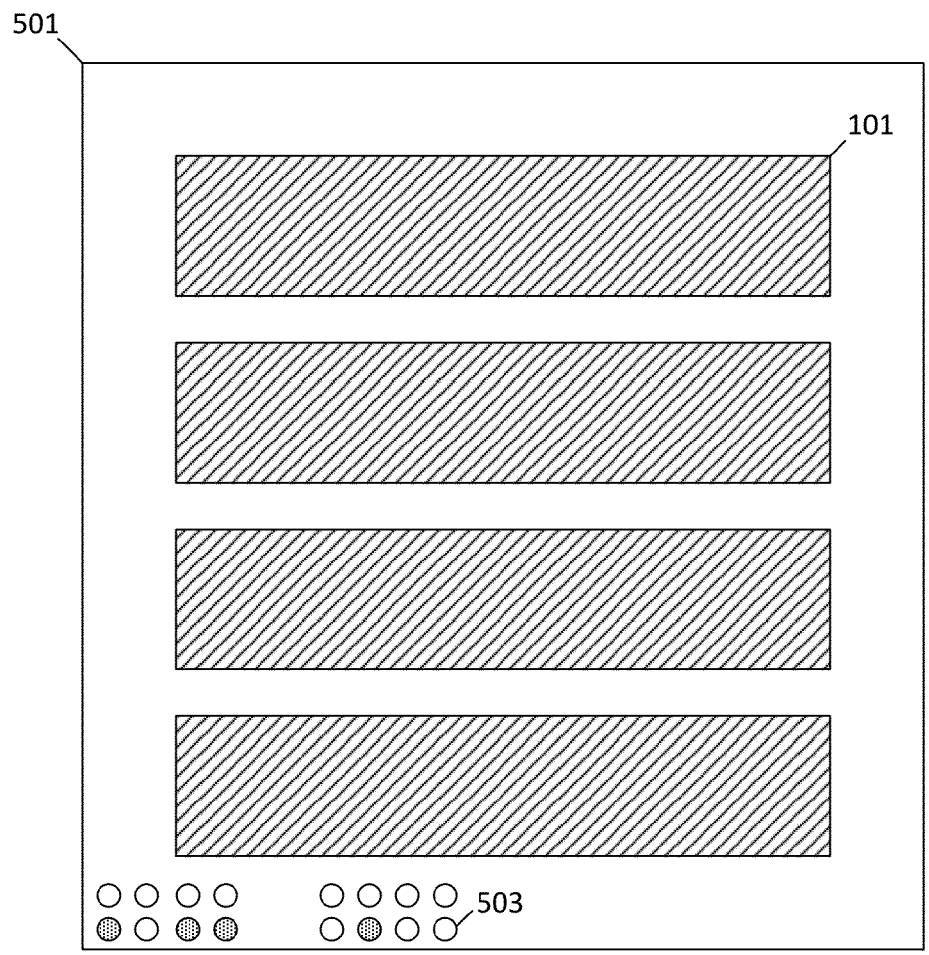

FIG. 5-1 is a side-view schematic diagram illustrating a method for tracking interposer dies in an SSIT product according to some embodiments. An interposer die 501 with a plurality of dummy microbumps 503 undergoes fluorescent ink deposition to form a unique identifier for the interposer die 501. Unlike the fluorescent ink deposition technique described in FIG. 4-1, fluorescent ink is deposited onto the dummy microbumps 503 in FIG. 5-1 using a carrier material 505 with pre-patterned fluorescent materials 507. The carrier material 505 with pre-patterned fluorescent material 507 is placed in contact with the interposer die 501 with the dummy microbumps 503 in a manner similar to stamping to pattern the dummy microbumps 503. Thereafter the carrier material 505 with pre-patterned fluorescent material 507 is removed from the interposer die 501 with the dummy microbumps 503. Any fluorescent material 507 that may be viewed using a fluorescent scanner or reader may be used.

FIG. 5-2 is a top-view schematic diagram of an SSIT product with an interposer die that has been modified according to the method of FIG. 5-1 according to some embodiments.

As illustrated in FIG. 5-2, the plurality of dummy microbumps 503 on the interposer die 501 are patterned using fluorescent ink deposition via carrier material to represent a unique identifier for the interposer die 501.

As mentioned above, the modified dummy microbumps may be used to track the wafer of origin from which the interposer die originated, the location on the wafer of origin from which the interposer die originated, the wafer lot from which the interposer die originated, or one or more particular electrical characteristics associated with the interposer die (e.g., leakage current), for example.

Also, as mentioned above, the dummy microbumps may be partitioned into various segments, wherein the set of modified dummy microbumps for each segment may be used to identify a different characteristic associated with the interposer die (e.g., wafer of origin, location on the wafer of origin, wafer lot, leakage current, etc.). For example, while the configuration of the dummy microbumps 503 in FIG. 5-2 may represent a single identification, in other embodiments, the configuration may represent two identifications (e.g., one identification represented by the eight dummy microbumps on the left side, and another identification represented by the eight dummy microbumps on the right side).

In the above, although sixteen dummy microbumps 303/403/503 are shown in the examples, in other embodiments, there may be more than sixteen dummy microbumps, or fewer than sixteen dummy microbumps. Also, in other embodiments, instead of having two groups of eight dummy microbumps, there may be only one group of dummy microbumps, or more than two groups of microbumps, with each group having more or fewer than eight dummy microbumps.

Figures 1, 6:
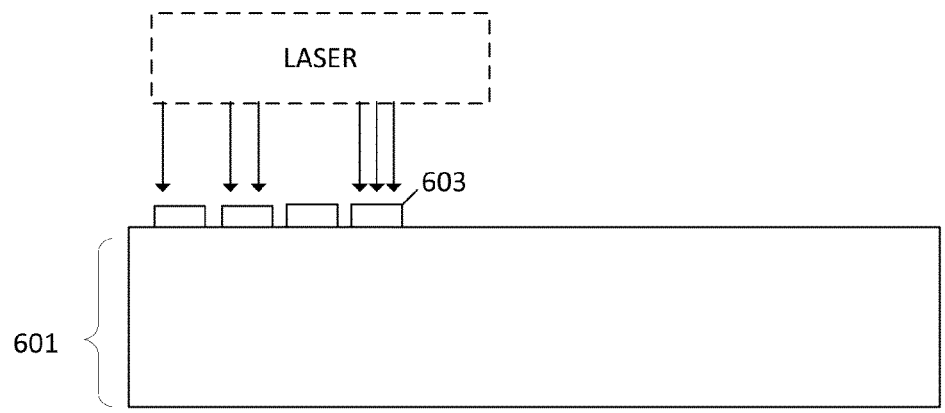
Figures 2, 6:
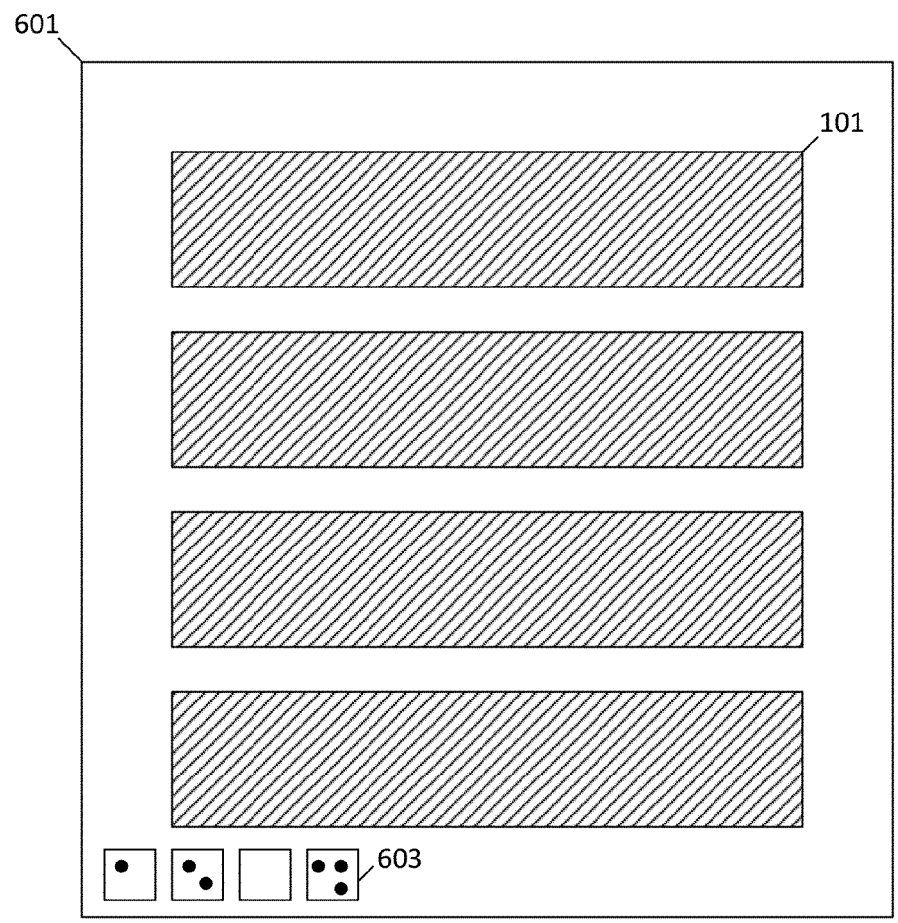

FIG. 6-1 is a side-view schematic diagram illustrating a method for tracking interposer dies in an SSIT product according to some embodiments. An interposer die 601 with a plurality of dummy aluminum pads 603 undergoes laser zapping to form a unique identifier for the interposer die 601. Unlike dummy microbumps that are eliminated by laser zapping, laser zapping a dummy aluminum pad 603 forms markings in the dummy aluminum pad 603 such that a pattern formed by the markings of the plurality of dummy aluminum pads 603 after laser zapping represents a unique identifier for the interposer die 601. Each dummy aluminum pad 603 of the interposer die 601 may be laser zapped more than once. The dummy aluminum pads that have been laser zapped are depicted as patterned aluminum pads 603 in FIG. 6-1. Various locations of aluminum pads 603 may be laser zapped and various combinations of aluminum pads 603 may be laser zapped to form different unique identifiers for an interposer die 601.

FIG. 6-2 is a top-view schematic diagram of an SSIT product with an interposer die that has been modified according to the method of FIG. 6-1 according to some embodiments.

As illustrated in FIG. 6-2, the plurality of dummy aluminum pads 603 on the interposer die 601 are patterned using laser zapping to represent a unique identifier for the interposer die 601. In the illustrated example, the four patterns in the respective aluminum pads 603 collectively form an identifier. In other embodiments, a first subset of the pads 603 (e.g., one pad) may form a first identifier, and a second subset of the pads 603 (e.g., two or more pads) may collectively form a second identifier. Also, in other embodiments, each of the patterns in each respective pad 603 provides an identifier. In the illustrated example, each pattern in the pad 603 includes one or more dots. In other examples, each pattern may include other configurations. For example, in other embodiments, one or more of the patterns may include line(s) (e.g., rectilinear line(s), curvilinear line(s), or combination thereof), geometric shapes (e.g., square(s), triangle(s), etc.), customized shape(s), number(s), text(s), or combination thereof.

As mentioned above, the modified dummy aluminum pads may be used to track the wafer of origin from which the interposer die originated, the location on the wafer of origin from which the interposer die originated, the wafer lot from which the interposer die originated, or one or more particular electrical characteristics associated with the interposer die (e.g., leakage current), for example.

Also, as mentioned above, the dummy aluminum pads may be partitioned into various segments, wherein the set of modified dummy aluminum pads for each segment may be used to identify a different characteristic associated with the interposer die (e.g., wafer of origin, location on the wafer of origin, wafer lot, leakage current, etc.).

For example, the dummy aluminum pads 603 of the interposer die 601 in FIG. 6-2 may be segmented to represent a coordinate system. The coordinate system may be used to identify the location of the wafer of origin from which the interposer die 601 originated. The two dummy aluminum pads on the left may represent an X coordinate, and the two dummy aluminum pads on the right may represent a Y coordinate. The left-most dummy aluminum pad of each segment may represent a sign (i.e., negative or positive), wherein a dummy aluminum pad that has been zapped represents a positive number and a dummy aluminum pad that has not been zapped represents a negative number. The right-most dummy aluminum pad of each segment may represent an absolute value. Thus, the dummy aluminum pads 603 of the interposer die 601 of FIG. 6-2 represent a coordinate value of (2, −3). This coordinate value may identify a particular location on the wafer of origin from which the interposer die 601 originated.

Although the example described above partitions the dummy aluminum pads into segments representing a coordinate system, it is important to note that various segments representing various characteristics associated with the interposer die may be used.

As mentioned above, tracking the interposer die to its wafer of origin, its location on the wafer of origin, its wafer lot, and to its electrical characteristics allows defective interposer dies to be easily identified and further provides quick feedback for identifying other potentially defective SSIT products that may be associated with the defective interposer die. Furthermore, particular characteristics for interposer dies (e.g., leakage current) may be easily identified to facilitate establishment of performance criteria for SSIT products.

Although particular embodiments have been shown and described, it will be understood that they are not intended to limit the claimed invention, and it will be made obvious to those skilled in the art that various changes and modifications may be made without departing from the claimed invention. The specification and drawings are, accordingly, to be regarded in an illustrative rather than restrictive sense. The claimed invention is intended to cover alternatives, modifications, and equivalents.

What is claimed is:

1. An apparatus for a stacked silicon interconnect technology (SSIT) product, comprising:
    an interposer die;
    a plurality of integrated circuit dies;
    a plurality of active components forming an active connection between the integrated circuit dies and the interposer die;
    a plurality of dummy components at the interposer die, the dummy components not forming an active connection between the integrated circuit dies and the interposer die;
    wherein at least a subset of the dummy components forms a pattern; and
    wherein the pattern comprises an identifier for the interposer die.

2. The apparatus of claim 1, wherein:
    the active components comprise active microbumps; and
    the dummy components comprise dummy microbumps.

3. The apparatus of claim 2, wherein the pattern comprises one or more locations from which a microbump has been eliminated by laser zapping.

4. The apparatus of claim 2, wherein at least one of the dummy microbumps in the pattern comprises fluorescent ink deposited onto the dummy microbump to form the pattern.

5. The apparatus of claim 1, wherein:
    the plurality of dummy components are partitioned into various subsets; and
    each of the various subsets identifies a different characteristic associated with the interposer die.

6. The apparatus of claim 1, wherein the identifier for the interposer die is configured to track at least one of the following:
    a wafer of origin from which the interposer die originated;
    a location on the wafer of origin from which the interposer die originated;
    a wafer lot from which the interposer die originated; or
    one or more electrical characteristics associated with the interposer die.

7. An apparatus for a stacked silicon interconnect technology (SSIT) product, comprising:
    an interposer die;
    a plurality of integrated circuit dies;
    a plurality of active microbumps forming an active connection between the integrated circuit dies and the interposer die;

a plurality of dummy microbumps at the interposer die, the dummy microbumps not forming an active connection between the integrated circuit dies and the interposer die;

wherein the plurality of dummy microbumps comprises an identifier for the interposer die.

8. The apparatus of claim 7, wherein at least one of the plurality of dummy microbumps comprises fluorescent ink deposited onto the dummy microbump to form the pattern.

9. The apparatus of claim 7, wherein:
the plurality of dummy microbumps are partitioned into various subsets; and
each of the various subsets identifies a different characteristic associated with the interposer die.

10. The apparatus of claim 7, wherein the identifier for the interposer die is configured to track at least one of the following:
a wafer of origin from which the interposer die originated;
a location on the wafer of origin from which the interposer die originated;
a wafer lot from which the interposer die originated; or
one or more electrical characteristics associated with the interposer die.

11. An apparatus for a stacked silicon interconnect technology (SSIT) product, comprising:
an interposer die;
a plurality of integrated circuit dies;
a plurality of active aluminum pads forming an active connection between the integrated circuit dies and the interposer die;
a plurality of dummy aluminum pads at the interposer die, the dummy aluminum pads not forming an active connection between the integrated circuit dies and the interposer die;
wherein the plurality of dummy aluminum pads comprises an identifier for the interposer die.

12. The apparatus of claim 11, wherein at least one of the plurality of dummy aluminum pads comprises markings from laser zapping to form the identifier.

13. The apparatus of claim 12, wherein the markings comprise one or more of the following: lines, geometric shapes, numbers, or texts.

14. The apparatus of claim 11, wherein the plurality of dummy aluminum pads represent a coordinate system.

15. The apparatus of claim 14, wherein the coordinate system identifies a location of a wafer of origin from which the interposer die originated.

16. The apparatus of claim 11, wherein:
the dummy aluminum pads are partitioned into various segments; and
each of the segments identifies a different characteristic associated with the interposer die.

17. The apparatus of claim 11, wherein the identifier for the interposer die is configured to track at least one of the following:
a wafer of origin from which the interposer die originated;
a location on the wafer of origin from which the interposer die originated;
a wafer lot from which the interposer die originated; or
one or more electrical characteristics associated with the interposer die.

* * * * *